(12) United States Patent
Hung et al.

(10) Patent No.: US 9,006,804 B2
(45) Date of Patent: Apr. 14, 2015

(54) SEMICONDUCTOR DEVICE AND FABRICATION METHOD THEREOF

(71) Applicant: United Microelectronics Corp., Hsin-Chu (TW)

(72) Inventors: Ching-Wen Hung, Tainan (TW); Chih-Sen Huang, Tainan (TW); Po-Chao Tsao, New Taipei (TW); Shih-Fang Tzou, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/912,173

(22) Filed: Jun. 6, 2013

(65) Prior Publication Data

US 2014/0361352 A1 Dec. 11, 2014

(51) Int. Cl.
*H01L 29/76* (2006.01)
*H01L 21/28* (2006.01)
*H01L 29/78* (2006.01)

(52) U.S. Cl.
CPC .......... *H01L 21/28008* (2013.01); *H01L 29/78* (2013.01)

(58) Field of Classification Search
CPC .......................... H01L 21/28008; H01L 29/78
USPC .................... 257/288, 774, E23.142, E23.145
See application file for complete search history.

(56) References Cited

U.S. PATENT DOCUMENTS

| | | |
|---|---|---|
| 6,043,138 A | 3/2000 | Ibok |
| 6,228,731 B1 | 5/2001 | Liaw |
| 6,492,216 B1 | 12/2002 | Yeo |
| 6,921,963 B2 | 7/2005 | Krivokapic |
| 7,087,477 B2 | 8/2006 | Fried |
| 7,091,551 B1 | 8/2006 | Anderson |
| 7,247,887 B2 | 7/2007 | King |
| 7,250,658 B2 | 7/2007 | Doris |
| 7,309,626 B2 | 12/2007 | Ieong |
| 7,352,034 B2 | 4/2008 | Booth, Jr. |
| 7,470,570 B2 | 12/2008 | Beintner |
| 7,531,437 B2 | 5/2009 | Brask |
| 7,569,857 B2 | 8/2009 | Simon |
| 8,048,790 B2 | 11/2011 | Soss |
| 2004/0195624 A1 | 10/2004 | Liu |
| 2005/0051825 A1 | 3/2005 | Fujiwara |
| 2005/0275006 A1 | 12/2005 | Tang |
| 2006/0046449 A1 | 3/2006 | Liaw |
| 2006/0099830 A1 | 5/2006 | Walther |
| 2006/0286729 A1 | 12/2006 | Kavalieros |
| 2007/0108528 A1 | 5/2007 | Anderson |
| 2007/0158756 A1 | 7/2007 | Dreeskornfeld |
| 2008/0157208 A1 | 7/2008 | Fischer |
| 2009/0124097 A1 | 5/2009 | Cheng |

(Continued)

*Primary Examiner* — Tan N Tran

(74) *Attorney, Agent, or Firm* — Winston Hsu; Scott Margo

(57) ABSTRACT

A method for fabricating a semiconductor device is provided herein and includes the following steps. First, a first interlayer dielectric is formed on a substrate. Then, a gate electrode is formed on the substrate, wherein a periphery of the gate electrode is surrounded by the first interlayer dielectric. Afterwards, a patterned mask layer is formed on the gate electrode, wherein a bottom surface of the patterned mask layer is leveled with a top surface of the first interlayer dielectric. A second interlayer dielectric is then formed to cover a top surface and each side surface of the patterned mask layer. Finally, a self-aligned contact structure is formed in the first interlayer dielectric and the second interlayer dielectric.

9 Claims, 6 Drawing Sheets

(56) References Cited

U.S. PATENT DOCUMENTS

| | | |
|---|---|---|
| 2009/0242964 A1 | 10/2009 | Akil |
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |
| 2011/0210380 A1* | 9/2011 | Scheiper et al. ............... 257/288 |
| 2012/0139062 A1* | 6/2012 | Yuan et al. .................... 257/411 |
| 2012/0156867 A1* | 6/2012 | Jeong et al. ................... 438/586 |

* cited by examiner

SEMICONDUCTOR DEVICE AND FABRICATION METHOD THEREOF

BACKGROUND OF THE INVENTION

1. Field of the Invention

The present invention generally relates to semiconductor devices and fabrication methods thereof, and more particularly to a semiconductor device having a metal electrode and a self-aligned contact (SAC) structure and a fabrication method thereof.

2. Description of the Prior Art

Along with the continuous miniaturization of the Integrated Circuits (IC), the feature size of each semiconductor device within the ICs also shrinks continuously. In order to overcome electrical or processing limitations arising from the miniaturization of semiconductor devices, semiconductor manufacturers have found out several solutions. For example, for a transistor device with a polysilicon gate, some disadvantages, such as boron penetration and depletion effect often occur and cause inferior performance of the transistor device. In order to solve these drawbacks, some semiconductor manufacturers adopt a gate-last process to replace the conventional polysilicon gate with a metal gate having metal electrode. Additionally, along with the shrinkage between two adjacent gate structures, semiconductor manufacturers also correspondingly invent a method for self-aligning a contact structure so as to overcome drawbacks due to the insufficient space between the two adjacent gate structures.

For a transistor device having both a metal gate and a self-aligned contact structure, a mask layer is often formed to cover the metal gate prior to the formation of the self-aligned contact structure. In the case where the gate electrode is covered by the mask layer, even though the self-aligned contact structure is formed close to the metal gate, there is still no unnecessary contact between them.

However, the processes for fabricating the transistor device having the metal gate and the self-aligned contact structure incur other drawbacks. Since steps for forming the mask layer often include removing an upper portion of the metal gate to leave a trench and filling up the trench with the mask layer, these steps often inevitably reduce the height of the metal gate. It is known that the electrical property of a transistor device is strongly related to the height of a metal gate. In order to maintain the height of the final metal gate within a predetermined value, semiconductor manufacturers often increase the height of an initial dummy gate. However, this solution results in other unwanted problems, such as the tendency of dummy gate to break during a polishing process, the intense shadowing effect arising from the dummy gate during an ion implantation process, the difficulty to fill up the space between two adjacent dummy gates with a dielectric layer and to fill a metal layer into a gate trench. Furthermore, since a planarization process is carried out during a process for forming the mask layer, a dishing phenomenon generally occurs on surface of the relatively large-sized mask layer.

Accordingly, in order to overcome the above-mentioned drawbacks, there is still a need to provide a modified structure having a metal gate and a self-aligned contact structure and a method thereof.

SUMMARY OF THE INVENTION

One object of the present invention is to provide a semiconductor device having a metal gate and a self-aligned contact structure and a method thereof so as to solve the drawbacks in convention technologies.

According to one preferred embodiment of the present invention, a method for fabricating a semiconductor device is provided. The method includes the following steps. First, a first interlayer dielectric is formed on a substrate. Then, a gate electrode is formed on the substrate, wherein a periphery of the gate electrode is surrounded by the first interlayer dielectric. Afterwards, a patterned mask layer is formed on the gate electrode, wherein a bottom surface of the patterned mask layer is leveled with a top surface of the first interlayer dielectric. A second interlayer dielectric is then formed to cover a top surface and each side surface of the patterned mask layer. Finally, a self-aligned contact structure is formed in the first interlayer dielectric and the second interlayer dielectric.

According to another preferred embodiment of the present invention, a semiconductor device is provided and includes a metal gate electrode, a first interlayer dielectric layer, a patterned mask layer, a second interlayer dielectric layer and a self-aligned contact structure. The metal gate electrode is disposed on a substrate. The first interlayer dielectric surrounds a periphery of the metal gate electrode. The patterned mask layer is disposed on the metal gate electrode, wherein a bottom surface of the patterned mask layer is leveled with a top surface of the first interlayer dielectric. The second interlayer dielectric covers a top surface and at least a sidewall of the patterned mask layer. The self-aligned contact structure is disposed in the first interlayer dielectric and the second interlayer dielectric, and is electrically connected to the substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 are schematic cross-sectional diagrams showing a method for fabricating a semiconductor device according to a first preferred embodiment of the present invention, wherein:

FIG. 1 is a schematic diagram showing a semiconductor device at the beginning of the fabrication process;

FIG. 2 is a schematic diagram showing a semiconductor device after carrying out a replacement metal gate process;

FIG. 3 is a schematic diagram showing a semiconductor device after depositing a mask layer;

FIG. 4 is a schematic diagram showing a semiconductor device after forming a patterned mask layer;

FIG. 5 is a schematic diagram showing a semiconductor device after depositing a dielectric layer;

FIG. 6 is a schematic diagram showing a semiconductor device after forming spacers;

FIG. 7 is a schematic diagram showing a semiconductor device after forming a contact hole; and FIG. 8 and FIG. 9 are schematic diagrams showing a semiconductor device after forming a contact structure;

DETAILED DESCRIPTION

Figure 1:
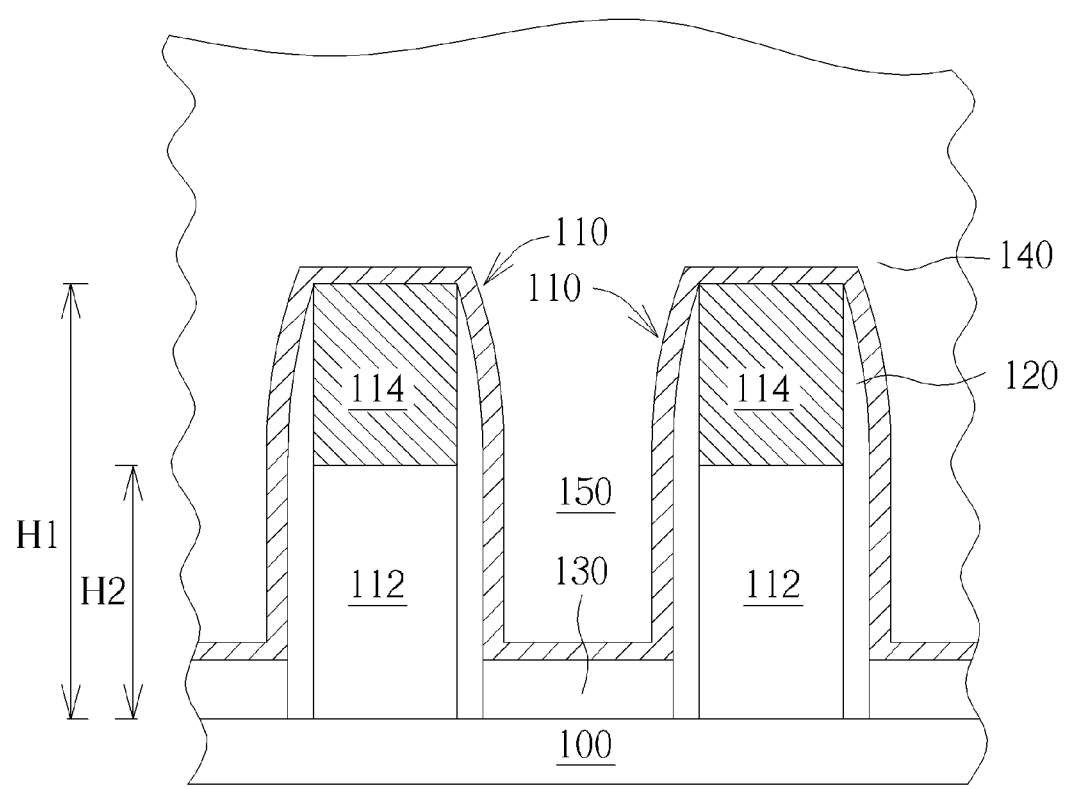

FIG. 1 to FIG. 9 are schematic cross-sectional diagrams showing a method for fabricating a semiconductor device according to a first preferred embodiment of the present invention. In the following paragraphs, processes for fabricating a semiconductor device having a transistor structure and a contact structure are described in detail. Please refer to FIG. 1. FIG. 1 is a schematic diagram showing a semiconductor device at the beginning of the fabrication process. As shown in FIG. 1, a substrate having stack structures, spacers, epitaxial layers, doped regions, cap layers and dielectric layers disposed thereon or therein is provided. For example, the substrate 100 may be a semiconductor substrate with several optional protruding fin structures on its surface, but not limited thereto. The stack structures may be dummy gate structures 110 and each of dummy gate structure 110 may include an interfacial layer (not shown), a sacrificial layer 112 and a cap layer 114 stacked from bottom to top. The spacers may be gate spacers 120 respectively disposed on the sidewalls of each of the dummy gate structures 110. The epitaxial layers 130 are disposed inside or outside the substrate 100 and are respectively disposed on each side of the dummy gate structure 110, but not limited thereto. The doped regions (not shown) may be, for example, lightly-doped drains (LDD) and/or source/drain regions and are respectively disposed on each side of each dummy gate structure 110. Besides, the doped regions may be optionally located in the substrate 100 or the epitaxial layers 130, but not limited thereto. The cap layer and the dielectric layer may respectively correspond to an etch stop layer 140 and a first interlayer dielectric 150 and are sequentially stacked on the substrate 100. Additionally, the etch stop layer 140 may conformally cover the gate spacers 120, the epitaxial layers 130 and the cap layer 114.

The above-mentioned substrate 100 may be selected from a silicon substrate, a silicon-germanium substrate or a silicon-on-insulator (SOI) substrate, but not limited thereto. In a case where the surface of the substrate 100 has protruding fin structures, the bottom of each dummy gate structure 110 may surround a section of the corresponding protruding fin structure. The interfacial layer (not shown), the sacrificial layer 112 and the cap layer 114 in each dummy gate structure 110 may respectively correspond to an oxide layer, a silicon layer and a nitride layer, for example a silicon oxide layer, a polysilicon layer and a silicon nitride layer, but not limited thereto. The gate spacers 120 may be selected from a silicon nitride, a silicon carbide, a silicon carbon nitride, a silicon oxynitride or other suitable semiconductor compounds. The epitaxial layers 130 disposed at two sides of the dummy gate structures 110 may be selected from doped or un-doped semiconductor materials, such as silicon germanium, silicon phosphor, silicon carbon or the like. The epitaxial layers 130 may impose required stress on channel regions of the semiconductor device and accordingly improve the carrier mobility in the channel regions. The etch stop layer 140 may be selected from a silicon carbon nitride, a silicon oxynitride, a silicon nitride, a silicon carbide or other suitable semiconductor compounds. The etch stop layer 140 may also impose required stress on the channel regions and/or act as an etch stop layer during a subsequent process for forming a contact structure. The first interlayer dielectric 150 may be selected from non-conductive dielectric materials, such as silicon oxide or the like.

At this stage, there is a first height H1 between the top surface of each cap layer 114 and that of the substrate 100, while there is a second height H2 between the top surface of the sacrificial layer 112 and that of substrate 100. The first height H1 approximately ranges from 1000 Angstrom to 2000 Angstrom and preferably is 1300 Angstrom. The second height H2 approximately ranges from 700 Angstrom to 1200 Angstrom and preferably is 900 Angstrom.

Then, a polishing process and/or an etching process is carried out, such as a chemical mechanical polishing process, to remove the cap layer 114 completely until the exposure of the top surface of the sacrificial layers 112. In this process, since a portion of the sacrificial layer 112 in each dummy gate structure 110 may be removed, a height between the top surface of each sacrificial layer 112 and that of the substrate 100 may be slightly reduced.

Figure 2:
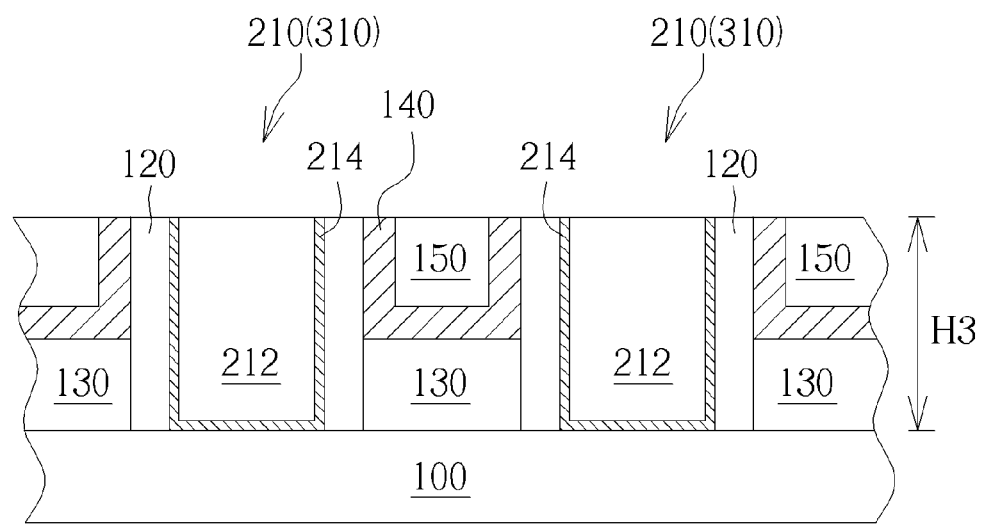

Please refer to FIG. 1 and FIG. 2. FIG. 2 is a schematic diagram showing a semiconductor device after carrying out a replacement metal gate process. After the exposure of the top surface of the sacrificial layer 112, a replacement metal gate (RMG) process may be carried out so as to form a structure shown in FIG. 2. Please refer to FIG. 1 and FIG. 2; the process may at least include the following steps. First, the sacrificial layer 112 within each dummy gate structure 110 is removed in order to leave a trench 210. Then, a dielectric layer 214, a work function metal layer (not shown) and a conductive layer is sequentially filled into the trench 210. A polishing process is carried out afterwards to remove the dielectric layer 214, the work function metal layer and the conductive layer outside the trench 210 until the interlayer dielectric layer 150 is exposed. At this time, several metal gate structures 310 are obtained and a conductive layer in each trench 210 may act as a gate electrode 212 of the metal gate structures 310.

At this stage, the top surface of the gate electrode 212 is preferably substantially leveled with that of the first interlayer dielectric 150. Besides, there is a third height H3 between the top surface of the gate electrode 212 and that of the substrate 100. Since the above-mentioned polishing process may not only remove the conductive layers, but also remove a portion of the gate spacers 120, the etch stop layer 140 and the first interlayer dielectric 150, the third height H3 may be therefore slightly lower than the second height H2. The difference between them may range from 50 Angstrom to 300 Angstrom, preferably is 150 Angstrom. In addition, the top surface of each gate electrode 212 may be slightly lower than that of the gate spacers 120, the etch stop layer 140 and the first interlayer dielectric 150, but not limited thereto.

The dielectric layer 214 is preferably a high-k dielectric layer with a dielectric constant substantially greater than 20. As an example, the dielectric layer 214 could be selected from the group consisting of hafnium oxide ($HfO_2$), hafnium silicon oxide (HfSiO), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), but not limited thereto. Additionally, the work function metal layers include titanium nitride (TiN), titanium carbide, (TiC), tantalum nitride (TaN), tantalum carbide (TaC), tungsten carbide (WC) or aluminum titanium nitride (TiAlN), but not limited thereto. The gate electrodes 152 may include metal or metal oxide with superior filling ability and relative low resistance, such as aluminum (Al), titanium aluminum (TiAl), titanium aluminum oxide (TiAlO), tungsten (W) or copper (Cu), but not limited thereto.

Additionally, since the above-mentioned process is a gate-last process accompanied with a high-k last process, both the dielectric layer 214 and the work function layer are preferably disposed on the sidewalls and the bottom of each trench 210. However, the present embodiment is not limited thereto. In other words, a gate-first process accompanied with a high-k first process may be applied instead. In this way, prior to the removal of the sacrificial layer, the substrate 100 within the trench 210 may be covered by the high-k dielectric layer. In addition, a barrier layer (not shown) may be optionally formed and may cover the high-k dielectric layer so that the high-k dielectric layer is not removed along with the sacrificial layer. The barrier layer may be a metal layer, such as a titanium nitride layer.

Figure 3:
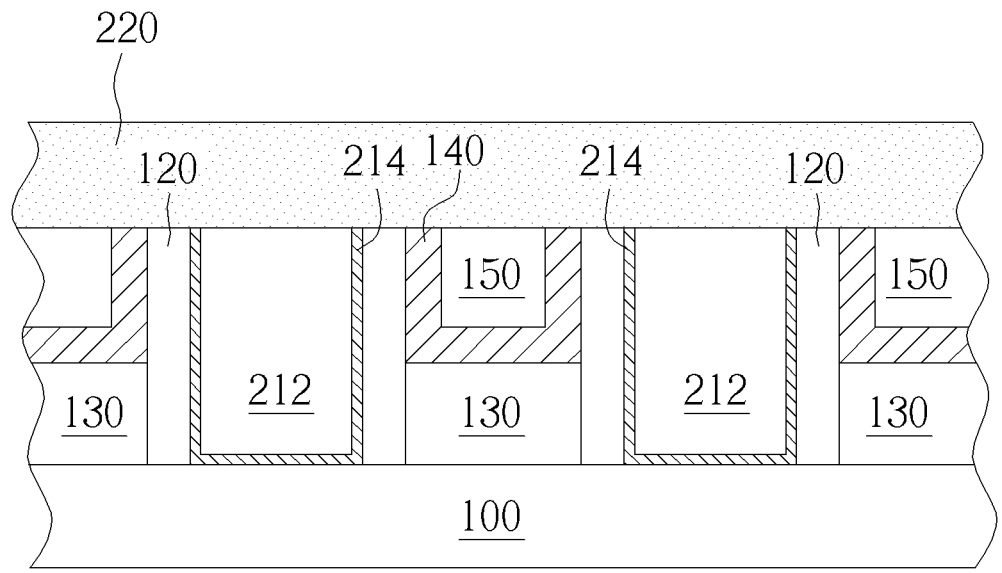

Please refer to FIG. 3. FIG. 3 is a schematic diagram showing a semiconductor device after depositing a mask layer. As shown in FIG. 3, a deposition process, such as a physical vapor deposition process, may be carried out to form a mask layer 220 with a thickness ranging from 200 Angstrom to 400 Angstrom, and preferably 350 Angstrom. The mask layer 220 may completely cover the gate electrodes 212, the gate spacers 120, the etch stop layer 140 and the first interlayer dielectric 150. Preferably, the composition of the mask layer 220 may include a silicon carbon nitride, a silicon oxynitride, a silicon nitride or a silicon carbide, which is different from that of the first interlayer dielectric layer 150. In this way, a required etching selectivity is defined among these layers, but not limited thereto.

Figure 4:
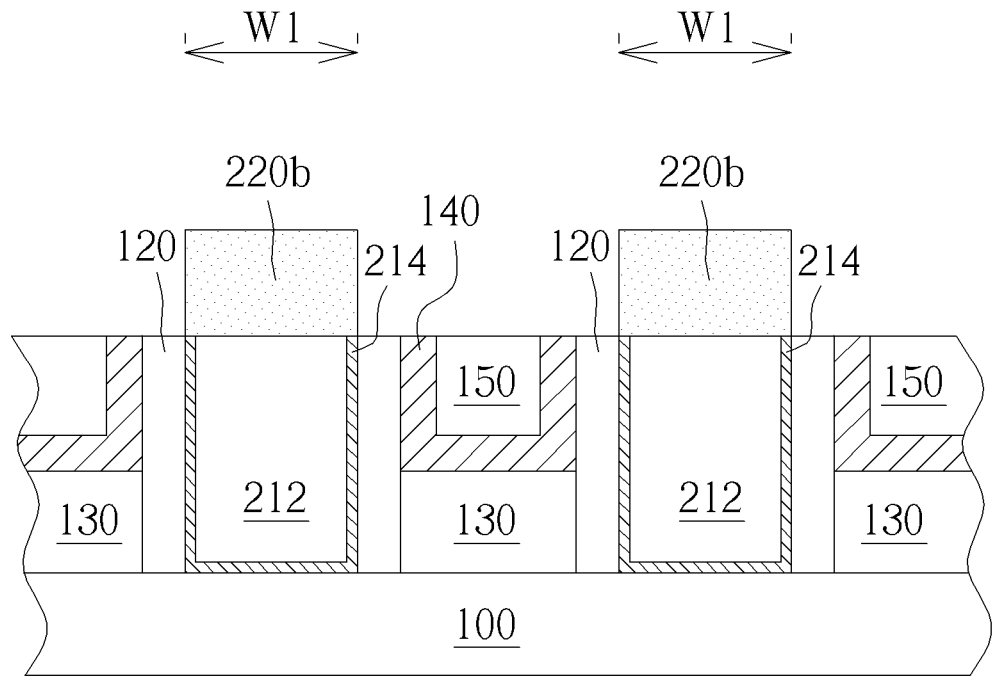

Please refer to FIG. 4. FIG. 4 is a schematic diagram showing a semiconductor device after forming a patterned mask layer. A photolithographic process and an etching process are carried sequentially. In this way, a patterned layer (not shown) is formed on the mask layer 220 and the pattern of the patterned layer may be transferred to the underneath mask layer 220 so as to form a patterned mask layer 220b shown in FIG. 4. To put it more concretely, the patterned layer may have a multi-layered structure, such as a structure including an organic dielectric layer (ODL)/an anti-reflective layer/a photoresist layer sequentially stacked from bottom to top, but not limited thereto. Additionally, the photolithographic process and/or the etching process preferably adopt a double patterning technology (DPT), but not limited thereto.

Still referring to FIG. 4, the patterned mask layers 220b are disposed on the gate electrodes 212, the gate spacers 120, the etch stop layer 140 and the first interlayer dielectric 150 and the gate electrode 212 and the dielectric layer 214 may be covered by the patterned mask layer 220b completely. For example, both the patterned mask layers 220b and the underneath gate electrode 212 along with the dielectric layer 214 may have a first width W1. In other words, the patterned mask layers 220b and the gate electrode 212 may substantially have the same critical dimension (CD). But the present invention is not limited to this; the width of each patterned mask layer may be slightly larger or narrower than that of each gate electrode and there may be a slight misalignment between them.

Figure 5:
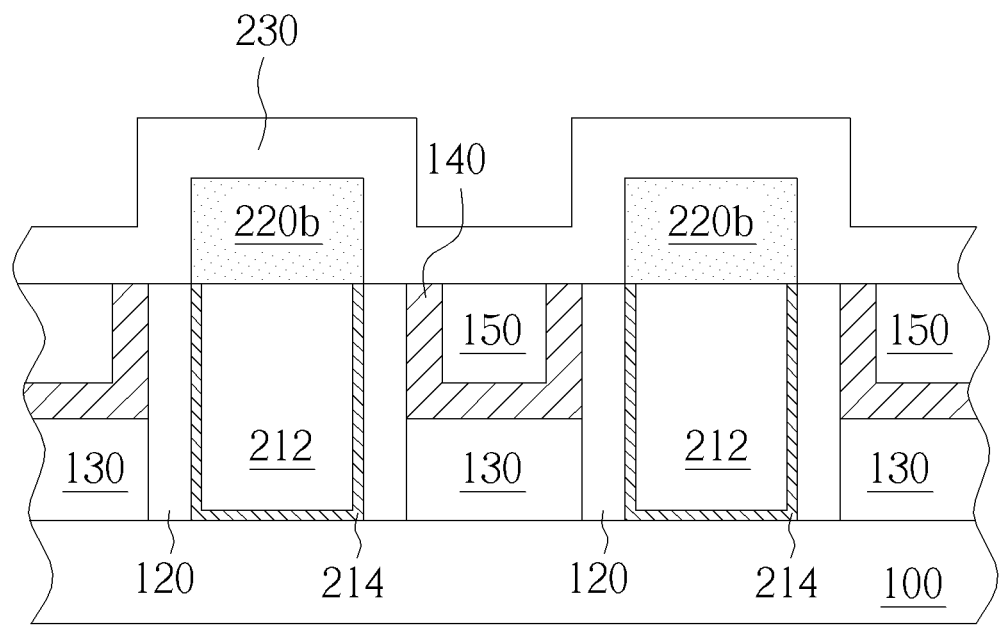
Figure 6:
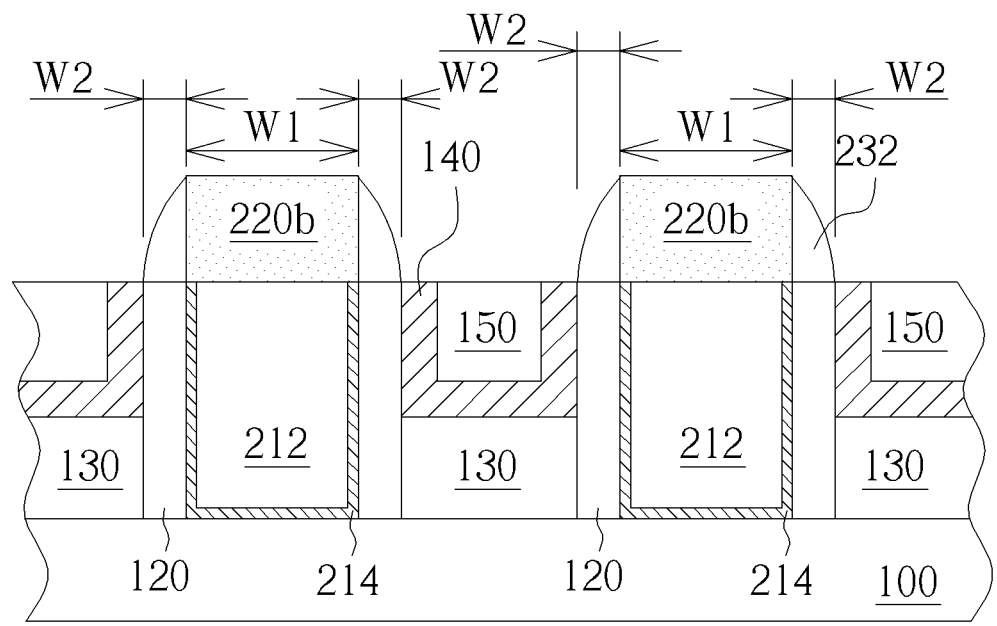

Please refer to FIG. 5 and FIG. 6. FIG. 5 is a schematic diagram showing a semiconductor device after depositing a dielectric layer. FIG. 6 is a schematic diagram showing a semiconductor device after forming spacers. As shown in FIG. 5, a deposition process, such as a physical vapor deposition process, a chemical vapor deposition process or an atomic layer deposition process, may be carried out to form a dielectric layer 230. The dielectric layer 230 may completely cover the gate electrodes 212, the gate spacers 120, the etch stop layers 140, the first interlayer dielectric 150 and the patterned mask layers 220b. The composition of the dielectric layer 230 may include a silicon carbon nitride, a silicon oxynitride, a silicon nitride or a silicon carbide that is different from that of the first interlayer dielectric layer 150. In this way, a required etching selectivity is defined among these layers, but not limited thereto. As shown in FIG. 6, by etching the dielectric layer 230 until the exposure of the interlayer dielectric 150, a spacer 232 may be formed on each sidewall of the patterned mask layers 220b. Preferably, each spacer 232 may have a second width W2 narrower than the first width W1 of the patterned mask layers 220b. One feature of the present embodiment is that each patterned mask layer 220b along with the spacers 232 on it sidewalls is able to completely cover the underneath corresponding gate electrode 212, the dielectric layer 214 and the work function metal layer. In other words, the total width of each patterned mask layer 220b along with the spacers 232 on it sidewalls is greater than that of the underneath gate electrode 212.

Figure 7:
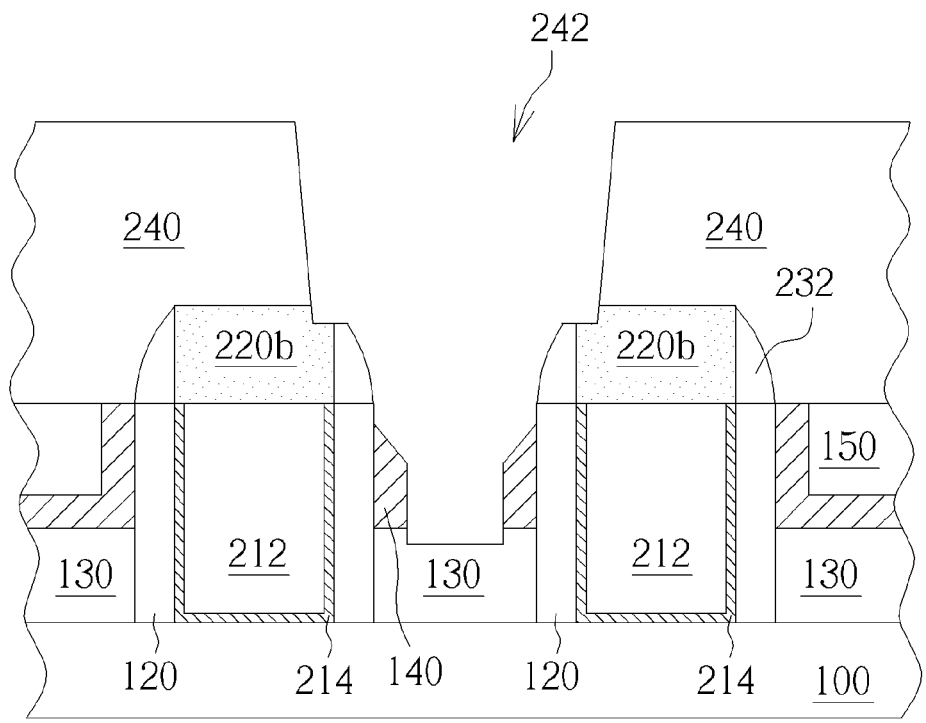

Please refer to FIG. 7. FIG. 7 is a schematic diagram showing a semiconductor device after forming a contact hole. After the formation of the patterned mask layer 220b and the spacers 232, a second interlayer dielectric 240, such as a pre-metal dielectric (PMD), may be deposited blankly to completely cover the patterned mask layers 220b, the spacers 232 and the first interlayer dielectric 150. The composition of the second interlayer dielectric 240 may be similar to that of the first interlayer dielectric 150, such as a silicon oxide, so that there is the same or similar etching rate between them. Then, a photolithographic process and an etching process are carried out to form a contact hole 242 in the second interlayer dielectric 240 and the first interlayer dielectric 150. The contact hole 242 may expose the epitaxial layers 130 or the substrate 100 disposed between each of the gate electrodes 212.

It should be noted that, there is a certain etching selectivity among the patterned mask layers 220b, the spacers 232, the gate spacers 120, the etch stop layer 140, the second interlayer dielectric 240 and the first interlayer dielectric 150. To put it more concretely, with the selected etchants and etching recipes, the etching rate of the patterned mask layers 220b, the spacers 232, the gate spacers 120 and the etch stop layer 140 is lower than the etching rate of the second interlayer dielectric 240 and the first interlayer dielectric 150. In this way, only a little amount of the patterned mask layer 220b, the spacers 232, the gate spacers 120 and the etch stop layer 140 may be removed during the etching process. Accordingly, even though a misalignment occurs during the photolithographic process, the contact hole 242 may only expose the epitaxial layer 130 or the substrate 100 rather than the gate electrodes 212. The etchants described above may be chosen from suitable gas etchants, such as $C_4F_6$, $C_5F_8$, $O_2$, Ar, CO, $CH_2F_2$ or the mixture thereof, but not limited thereto.

Figure 8:
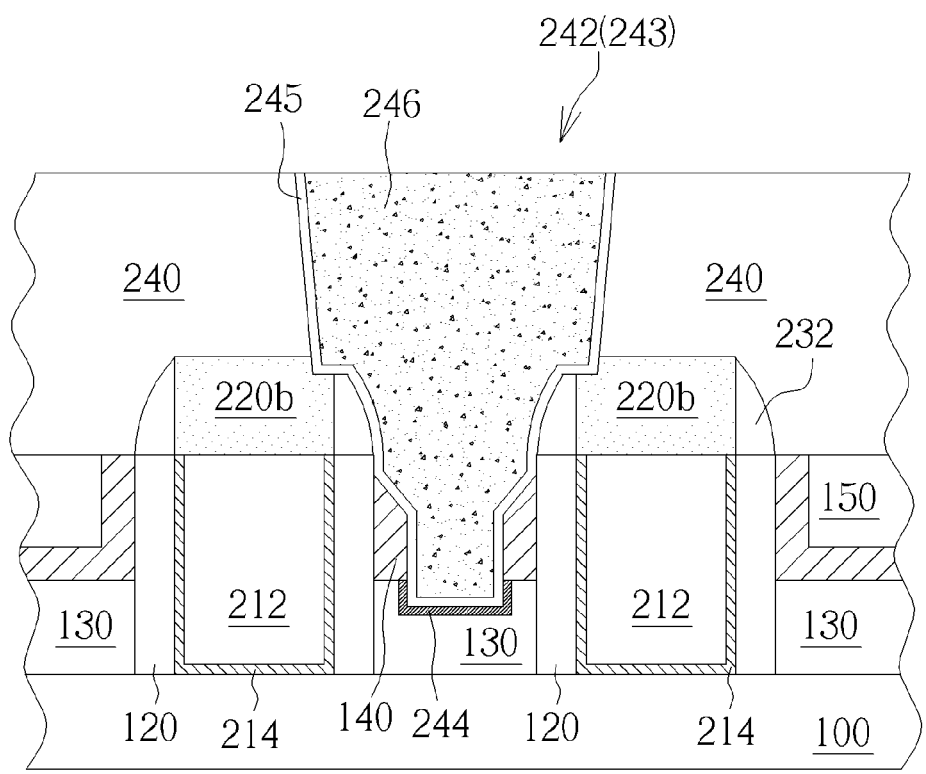

Please refer to FIG. 8. FIG. 8 is a schematic diagram showing a structure after the formation of a contact structure according to a first preferred embodiment of the present invention. As shown in FIG. 8, a self-aligned silicidation process is carried out to form a metal silicide 244 in the epitaxial layer 130. Afterwards, a self-aligned contact process is performed to sequentially fill a barrier layer 245 and a metal layer 246 into the contact hole 242 so as to form a self-aligned contact structure 243. It should be noted that the self-aligned contact structure 243 may directly contact the patterned mask layer 220b, the spacers 232, the gate spacers 120, the etch stop layer 140, the second interlayer dielectric 240 and the first interlayer dielectric 150, and electrically connect the underneath metal silicide 244, but not limited thereto.

The above-mentioned metal silicide 244 may be a silicide and metal element of the silicide may be selected from the group consisting of tungsten (W), aluminum (Al), copper (Cu), titanium (Ti), tantalum (Ta), niobium (Nb), erbium (Er), molybdenum (Mo), cobalt (Co), nickel (Ni), platinum (Pt) or alloys of which. The self-aligned contact structure 243 may be selected from the group consisting of tungsten (W), aluminum (Al), titanium (Ti), copper (Cu), molybdenum (Mo), cobalt (Co), platinum (Pt) or alloys of which. The barrier layer 245 includes titanium nitride (TiN), tantalum nitride (TaN), Ti/TiN or Ta/TaN, but not limited thereto.

Figure 9:
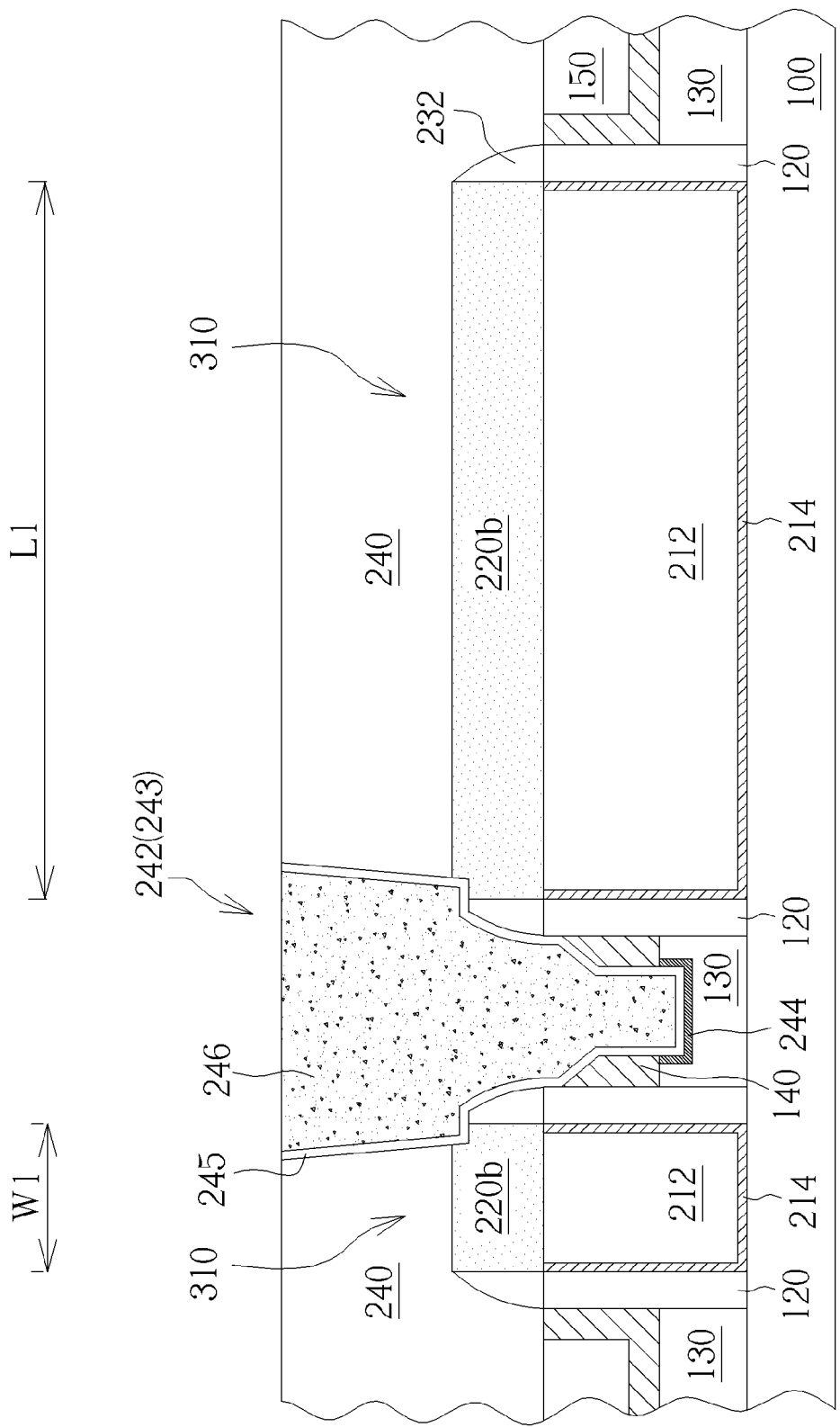

Please refer to FIG. 9. FIG. 9 is schematic diagram showing a semiconductor device after forming a contact structure. The processing time and the structure of the element depicted in FIG. 9 correspond to those of FIG. 8. However, FIG. 9 depicts a cross-sectional diagram of both a short axis and a long axis of the metal gate structure 310. As shown in FIG. 9, the metal gate structure 310 on the left side has a first width W1 similar to the first width W1 shown in FIG. 8, while the metal gate structure 310 on the right side of FIG. 9 has a first length L1 longer than the first width W1. Preferably, the first length L1 is 5 times longer than the first width W1. Since the deposition and the etching process is performed to form the patterned mask layer 220b, and a polishing process for the patterned mask layer 220b is not necessarily required, a dishing phenomenon will not occur on the metal gate structure 310 on the right side of FIG. 9.

According to the first preferred embodiment, the patterned mask layers 220b are formed through a deposition process and a patterning process. Since there is no need to remove an upper portion of the gate electrode 212 and polish the gate electrode 212 during or after the process for forming the patterned mask, the difference in height between the initial dummy gate structure 110 and the final metal gate structure 310 may be reduced. In this way, the height of the dummy gate structure 110 at the beginning of the fabrication process may be effectively reduced and the height of the subsequent trench 210 may also be reduced. Accordingly, the drawback of the dummy gate structure 110 being prone to break may be overcome; the shadowing effect caused by the dummy gate structure 110 during the ion implantation process may be avoided; the capability of filling the interlayer dielectric layer 150 and the conductive layer respectively into each dummy gate structure 110 and each trench 210 may all be improved. Furthermore, since there is no need to remove the upper portion of the gate electrode 212, even though there are defects, such as void defects, existing in the gate electrode 212, etchants are still not able to reach and damage the structure under the gate electrode 212, such as dielectric layer or substrate, through the defect. This also increases the yield rate of the fabrication process.

Additionally, since the sidewalls of the patterned mask layers 220b may be optionally further disposed with the spacers 232, even though the position of each initial dummy gate structure 110 slightly shifts, or the subsequent patterned mask layer 220b and/or contact hole 242 is misaligned, the spacers 232 may amend this deviation. In this way, the patterned mask layer 220b along with its spacers 232 may completely cover the underneath corresponding gate electrode 212. Accordingly, the non-necessary electrical contact between the self-aligned contact structure 243 and the gate electrode 212 may be avoided.

In the following paragraphs, several modifications according to the first embodiment of the present invention are disclosed. For the sake of clarity, only the main difference between each modification and the first preferred embodiment is described, the same or similar processes or structures may refer back to previously described first preferred embodiment.

Figure 10:
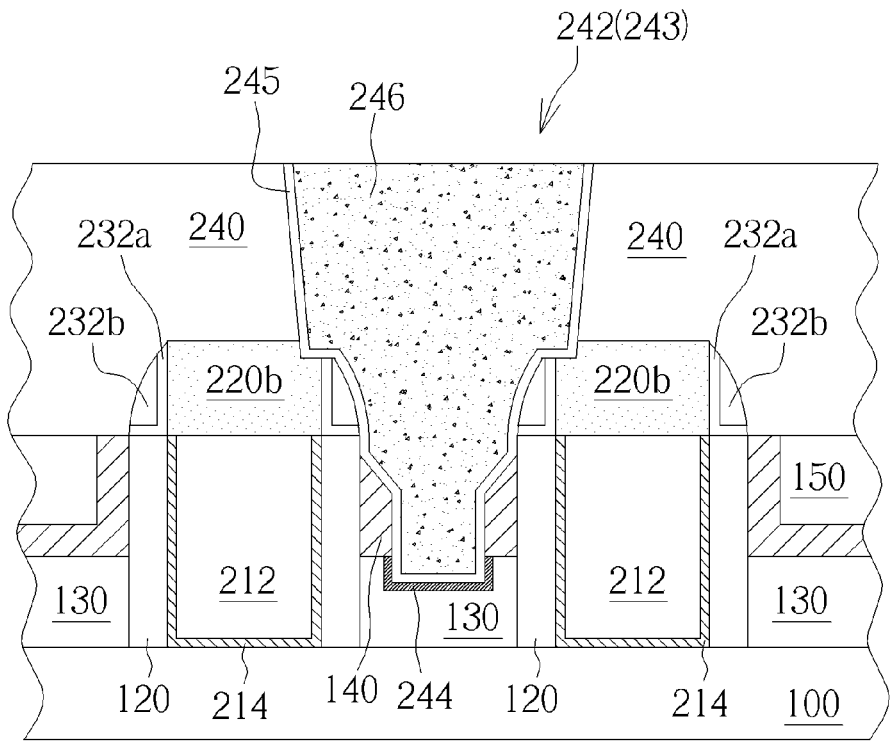
FIG. 10 is schematic cross-sectional diagram showing a semiconductor device according to a modification of a first preferred embodiment of the present invention.

Please refer to FIG. 10. FIG. 10 is schematic cross-sectional diagram showing a semiconductor device according to a modification of a first preferred embodiment of the present invention. Processes and structure according to this modification are substantially similar to those described in the first preferred embodiment. The main difference between these two embodiments is that the spacers respectively disposed at each side of the patterned mask layer 220b have a multi-layered structure, such as a double-layered structure composed of a lower spacer 232a and an upper spacer 232b. The lower spacer 232a and the upper spacer 232b may respectively correspond to an oxide layer and a nitride layer, but not limited thereto. Since the spacers have multi-layered structures, the first interlayer dielectric 150 under the spacers may not be over etched during the formation of the spacers. Since other characteristics and advantages of the present modification are all similar to those described in the first preferred embodiment, their description is therefore omitted for the sake of clarity.

Figure 11:
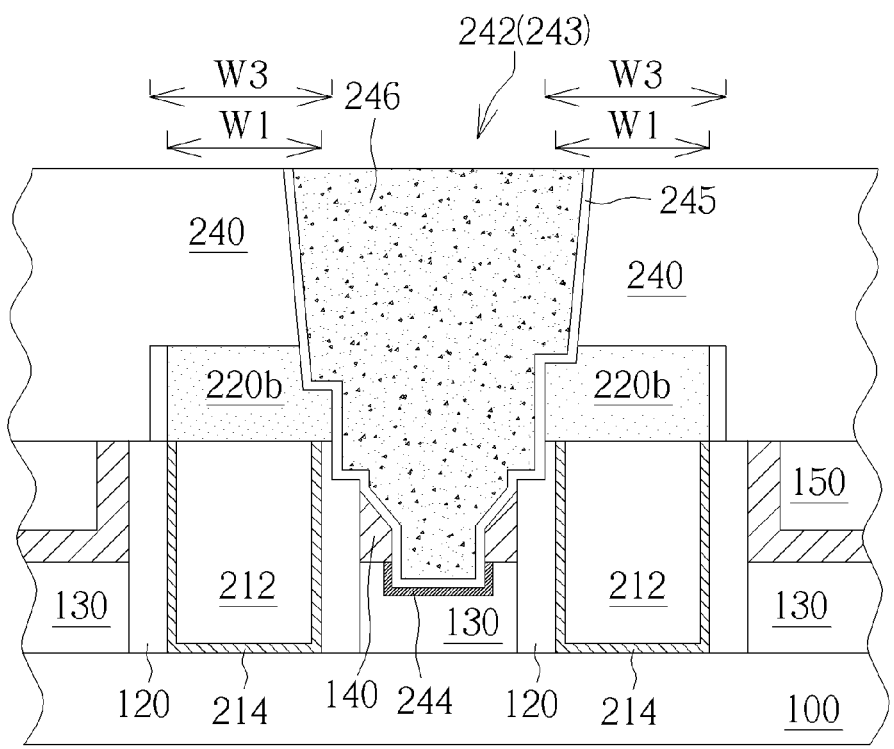
FIG. 11 is schematic cross-sectional diagram showing a semiconductor device according to another modification of a first preferred embodiment of the present invention.

Please refer to FIG. 11. FIG. 11 is schematic cross-sectional diagram showing a semiconductor device according to another modification of a first preferred embodiment of the present invention. Processes and structure according to this modification are substantially similar to those described in the first preferred embodiment. The main difference between these two embodiments is that no spacer is disposed on the sidewalls of the patterned mask layers 220b according to the present modification. In this way, the gate electrodes 212 may be only covered by the patterned mask layers 220b. It should be noted that, in order to ensure that the gate electrodes 212 are still under sufficient protection in case of a misalignment situation, the patterned mask layers 220b above the gate electrodes 212 may have a relatively wide width so as to amend the drawbacks resulting from the misalignment. To put it more concretely, the gate electrodes 212 and the patterned mask layers 220b respectively have a first width W1 and a third width W3, wherein the first width W1 is smaller than the third width W3. Since the other characteristics and advantages of the present modification are all similar to those described in the first preferred embodiment, their description is therefore omitted for the sake of clarity.

Additionally, although only the transistor device is described in the previous disclosure, it will be apparent that the present invention may be also applied to other types of semiconductor devices without departing from the scope of the present invention. For example, a portion of or all the metal gate structures may be replaced with resistor structures, capacitor structures, e-fused structures or other semiconductor devices. In other words, the self-aligned contact structure does not have to land between two adjacent metal gate structures, it also may land between two adjacent resistor structures or between a resistor structure and a metal gate structure, but not limited thereto.

To summarize, according to embodiments of the present invention, a patterned mask layer is formed on a metal electrode through a deposition and a patterning process, and a spacer is optionally formed on each sidewall of the patterned mask layer. Since an upper portion of the metal electrode does not have to be removed and a polishing process is not necessarily required during or after a process for forming the patterned mask layer, it is apparent that the difference in height between the initial and the final stack structure may be reduced and a dishing phenomenon occurring on patterned mask layer may be avoided. In this way, the height of the dummy gate structure at the beginning of the fabrication process may be effectively reduced and the height of the subsequent trench may also be reduced. Accordingly, the drawbacks of the dummy gate structure being prone to break may be overcome; the shadowing effect during the ion implantation process caused by the dummy gate structure may be avoided; the capability of respectively filling the interlayer dielectric layer and the conductive layer into each dummy gate structure and each trench may all be improved. Furthermore, the probability that etchants damage the structure under the gate electrode through the defects in the gate electrode is also reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a metal gate electrode, disposed on a substrate;
   a first interlayer dielectric, surrounding a periphery of the metal gate electrode;
   a patterned mask layer, disposed on the metal gate electrode, wherein a bottom surface of the patterned mask layer is leveled with a top surface of the first interlayer dielectric;
   a spacer disposed on the sidewalls of the patterned mask layer, wherein a bottom surface of the spacer is leveled with the bottom surface of the patterned mask layer;
   a second interlayer dielectric, covering a top surface and the sidewalls of the patterned mask layer; and
   a self-aligned contact structure disposed in the first interlayer dielectric and the second interlayer dielectric, and electrically connecting the substrate.

2. The semiconductor device of claim 1, wherein a top surface of the metal gate electrode is substantially leveled with the top surface of the first interlayer dielectric.

3. The semiconductor device of claim 1, wherein the first interlayer dielectric and the second interlayer dielectric comprise silicon oxide.

4. The semiconductor device of claim 1, wherein the patterned mask layer comprises silicon nitride, silicon carbon nitride, silicon oxynitride or silicon carbide.

5. The semiconductor device of claim 1, wherein a width of the patterned mask layer is substantially larger than a width of the metal gate electrode.

6. The semiconductor device of claim 1, wherein the spacer comprises silicon nitride, silicon carbon nitride, silicon oxynitride or silicon carbide.

7. The semiconductor device of claim 1, wherein the patterned mask layer and the spacer cover the metal gate electrode completely.

8. The semiconductor device of claim 1, further comprising:
   a gate spacer, disposed on sidewalls of the metal gate electrode; and
   an etch stop layer, disposed between each of the gate spacers and the self-aligned contact structure.

9. The semiconductor device of claim 8, wherein each of the gate spacers and each of the etch stop layers comprise silicon nitride, silicon carbon nitride, silicon oxynitride or silicon carbide.

* * * * *